United States Patent
Osada

(10) Patent No.: US 7,674,404 B2
(45) Date of Patent: Mar. 9, 2010

(54) GALLIUM OXIDE/ZINC OXIDE SPUTTERING TARGET, METHOD OF FORMING TRANSPARENT CONDUCTIVE FILM AND TRANSPARENT CONDUCTIVE FILM

(75) Inventor: Kozo Osada, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 30 days.

(21) Appl. No.: 12/094,024

(22) PCT Filed: Nov. 17, 2006

(86) PCT No.: PCT/JP2006/322944

§ 371 (c)(1),
(2), (4) Date: May 16, 2008

(87) PCT Pub. No.: WO2007/066490

PCT Pub. Date: Jun. 14, 2007

(65) Prior Publication Data

US 2009/0250669 A1 Oct. 8, 2009

(30) Foreign Application Priority Data

Dec. 8, 2005 (JP) .............. 2005-354918

(51) Int. Cl.
*H01B 1/06* (2006.01)
*B05D 5/12* (2006.01)

(52) U.S. Cl. .............. 252/519.51; 252/520.2; 204/192.13; 204/298.13

(58) Field of Classification Search ............ 252/519.51, 252/520.2; 204/192.13, 298.13
See application file for complete search history.

(56) References Cited

U.S. PATENT DOCUMENTS

| | | | |
|---|---|---|---|
| 6,528,442 B1 * | 3/2003 | Kuwano et al. | ........... 501/41 |
| 6,569,548 B2 | 5/2003 | Yamamoto et al. | |
| 7,279,211 B2 | 10/2007 | Yahagi et al. | |
| 7,510,635 B2 | 3/2009 | Shindo et al. | |
| 2006/0147740 A1 | 7/2006 | Hosono et al. | |
| 2007/0098626 A1 | 5/2007 | Shindo et al. | |
| 2008/0299415 A1 | 12/2008 | Hosono et al. | |
| 2009/0085014 A1 | 4/2009 | Ikisawa et al. | |
| 2009/0101493 A1 * | 4/2009 | Nakayama et al. | ...... 204/192.11 |
| 2009/0120786 A1 | 5/2009 | Osada | |
| 2009/0197757 A1 * | 8/2009 | Fukushima | ........... 501/127 |
| 2009/0200525 A1 | 8/2009 | Ikisawa et al. | |
| 2009/0206303 A1 | 8/2009 | Osada | |

FOREIGN PATENT DOCUMENTS

JP 2000-195101 A 7/2000

OTHER PUBLICATIONS

Sumiya et al., "SIMS Analysis of ZnO Films co-doped with N and Ga by Temperature Gradient Pulsed Laser Deposition", Applied Surface Science 223, pp. 206-209, 2004.
Gopalakrishnan et al., "Comparison of ZnO:GaN film on Si(111) and Si(100) Substrates by Pulsed Laser Deposition", Physica B 376-377, pp. 756-759, 2006.
Yuan et al., "p-Type Conduction in AL-N co-doped ZnO Films", Materials Letters 58, pp. 3741-3744, Aug. 19, 2004.
Look et al., "The Future of ZnO Light Emitters", Phys. Stan. Sol. (a) 201, No. 10, pp. 2203-2212, Jul. 22, 2004.
esp@cenet database, One Page English Abstract of JP 2005-219982 A1, Aug. 18, 2005.
esp@cenet database, One Page English Abstract of JP 06-177407 A1, Jun. 24, 1994.
esp@cenet database, One Page English Abstract of JP 10-306367 A1, Nov. 17, 1998.
esp@cenet database, One Page English Abstract of JP 10-297964 A1, Nov. 10, 1998.
esp@cenet database, One Page English Abstract of JP 11-256320 A1, Sep. 21, 1999.
esp@cenet database, One Page English Abstract of JP 2002-363732 A1, Dec. 18, 2002.

* cited by examiner

*Primary Examiner*—Mark Kopec
(74) *Attorney, Agent, or Firm*—Howson & Howson LLP

(57) ABSTRACT

Provided is a high-density gallium oxide/zinc oxide sintered sputtering target containing 20 massppm or greater of each zirconium oxide and aluminum oxide, wherein the total content thereof is less than 250 ppm. This gallium oxide ($Ga_2O_3$)/zinc oxide (ZnO) sputtering target (GZO target) improves the conductivity and bulk density of the target by adding trace amounts of specific elements. In other words, it is possible to obtain a target capable of increasing the sintered density, inhibiting the formation of nodules, and preventing the generation of abnormal electrical discharge and particles by improving the component composition. Further, provided are a method of forming a transparent conductive film with the use of the target, and a transparent conductive film formed thereby.

9 Claims, No Drawings

GALLIUM OXIDE/ZINC OXIDE SPUTTERING TARGET, METHOD OF FORMING TRANSPARENT CONDUCTIVE FILM AND TRANSPARENT CONDUCTIVE FILM

BACKGROUND OF THE INVENTION

The present invention relates to a gallium oxide ($Ga_2O_3$)/zinc oxide (ZnO) sputtering target (GZO target) for obtaining a transparent conductive film capable of maintaining a favorable optical transmission factor and conductivity. Further, it relates to a method of forming a transparent conductive film with the use of the target and relates to a transparent conductive film formed thereby.

Conventionally, as a transparent conductive film, an ITO film (i.e., tin-doped indium oxide film) is superior in transparency and conductivity, and is widely used as a transparent electrode (film) of display devices such as a liquid crystal display and an electro luminescence display, as well as in solar batteries. Nevertheless, since indium, which is the primary component of ITO, is expensive, there is a problem in that the manufacturing cost will increase.

Due to the foregoing reasons, the usage of a GZO film as a substitute for the ITO film is being proposed. This GZO film has the advantage of being inexpensive, since it is a zinc oxide film having gallium oxide ($Ga_2O_3$)/zinc oxide (ZnO) as its primary component. The GZO film is known to encounter a phenomenon of increased conductivity due to the oxygen defect of ZnO, which is the primary component thereof, and the increased use of such GZO film can be realized if the film characteristics such as conductivity and optical transparency can approximate the film characteristics of an ITO film.

As a method of forming the GZO film, the sputtering method is primarily used, and, in particular, direct current (DC) sputtering, radio frequency (RF) sputtering or magnetron sputtering is used from the perspective of operability and film stability.

Formation of a film based on the sputtering method is conducted by physically colliding positive ions such as Ar ions to a target disposed on a negative electrode, using such collision energy to discharge a material for configuring a target, and laminating a film having roughly the same composition as the target material on a substrate on the positive electrode opposite to the target.

The coating based on the foregoing sputtering method is characterized in being able to form a thin film of angstrom units to a thick film of several ten µm with a stable deposition speed by adjusting the processing time and power supply.

Several proposals have been made regarding a sintered sputtering target for forming this kind of GZO film, and a transparent conductive film formed thereby.

For example, Patent Document 1 proposes a zinc oxide sintered target, which is free from abnormal electrical discharge and capable of forming a stable thin film, as a part of the invention. In Patent Document 1, a $Ga_2O_3$/ZnO target sintered compact is used as a part of the target material, and zinc oxide in which titanium oxide, germanium oxide, aluminum oxide, magnesium oxide, indium oxide, and tin oxide are selectively added at 1 to 5 weight % is used as the primary component.

Patent Document 2 proposes a GZO sintered sputtering target, which is free from abnormal electrical discharge and capable of forming a stable thin film. In Patent Document 2, technology is proposed for improving the density by pulverizing the powders of zinc oxide and gallium oxide to a grain size of 1 µm or less, adjusting the sintering temperature at 1300 to 1550° C., and performing sintering while introducing oxygen.

Patent Document 3 proposes a GZO sintered sputtering target with a high transmission factor and a low resistance value and in which the occurrence of an abnormal electrical discharge is rare over a long period of time. In Patent Document 3, proposed is a ZnO sintered compact in which Ga is added at 3 to 7 atomic %, and a third element selected from Al, B, In, Ge, Si, Sn, and Ti is added at 0.3 to 3 atomic %.

Patent Document 4 proposes technology of performing sputtering in an atmosphere of hydrogen gas and inert gas in order to prevent changes in the electrical characteristics and optical characteristics due to zinc oxide reacting with moisture.

Generally speaking, a major problem in forming a GZO film is that minute protrusions called nodules occur in the erosion portion of the target surface due to sputtering, coarse grains (particles) float in the sputtering chamber caused by the abnormal electrical discharge and splash due to such nodules, and such particles adhere to the formed film and cause deterioration in quality. Further, the foregoing abnormal electrical discharge will cause an unstable plasma discharge, and there is a problem in that stable deposition cannot be realized.

Therefore, upon forming a conductive film on a substrate, it is necessary to periodically remove the nodules occurring on the sputtering target, and there is a problem in that this significantly deteriorates the productivity. Thus, a target which does not generate nodules and an abnormal electrical discharge phenomenon is in demand.

In particular, displays recently tend to be enlarged, and large-area deposition is required. Thus, a target capable of stable deposition is in particular being demanded.

In the foregoing Patent Documents, the problem of abnormal electrical discharge is being pointed out. Patent Document 1 described above suggests that titanium oxide, germanium oxide, aluminum oxide, magnesium oxide, indium oxide, and tin oxide are selectively added at 1 to 5 weight % as measures for reducing such abnormal electrical discharge. Patent Document 3 suggests that a third element selected from Al, B, in, Ge, Si, Sn, and Ti is added at 0.3 to 3 atomic %.

Each invention of the foregoing documents tries to prevent the abnormal electrical discharge by increasing the density of the sintered compact and reducing the holes in the sintered compact. Nevertheless, even with the use of these additive materials, there is a problem in that the sintered density cannot be sufficiently increased, and the bulk (volume) resistance value remains high.

Further, although it is possible to improve the manufacture process of the target, a complex manufacture process will result in increased costs. In addition, when attempting to increase the density by improving the sintering method or device, there is a problem in that the equipment must be enlarged, and this cannot be considered to be an industrially efficient method.

In addition, a GZO sintered target has drawbacks in that the bulk resistance value and density will change significantly and lack stability depending on the sintering conditions, and the composition will change since it easily reacts with the setter or the like during sintering.

Comprehensively, by adding trace elements, or by changing the component composition of the GZO sintered compact, it is possible to improve the target density, prevent the formation of nodules, and inhibit the abnormal electrical discharge phenomenon and generation of particles, and this would be a simple and effective method. Nevertheless, since change in the component composition will aggravate the bulk resistance value of the target and will not necessarily contribute to an improvement in the sintered density, there is a problem in that the examples described in the foregoing Patent Documents are insufficient as measures in overcoming the conventional problems.

[Patent Document 1] Japanese Patent Laid-Open Publication No. H10-306367

[Patent Document 2] Japanese Patent Laid-Open Publication No. H10-297964

[Patent Document 3] Japanese Patent Laid-Open Publication No. H11-256320

[Patent Document 4] Japanese Patent Laid-Open Publication No. 2002-363732

SUMMARY OF THE INVENTION

In light of the foregoing problems of conventional technology, the gallium oxide ($Ga_2O_3$)/zinc oxide (ZnO) sputtering target (GZO target) of the present invention improves the conductivity and density by adding trace amounts of specific elements. In other words, the present invention provides a target having high density, low bulk resistance and minimal compositional variation by improving the component composition so as to increase the sinterability of the GZO target.

It is thereby possible to obtain a target capable of inhibiting the formation of nodules, and preventing the generation of abnormal electrical discharge and particles. The present invention further provides a method of forming a transparent conductive film with the use of the target, and a transparent conductive film formed thereby.

Based on the above, the present invention provides:

1) A high-density gallium oxide/zinc oxide sintered sputtering target containing 20 massppm or greater of each of zirconium oxide and aluminum oxide, wherein the total content thereof is less than 250 ppm;

2) The high-density gallium oxide/zinc oxide sintered sputtering target according to paragraph 1) above, wherein the gallium concentration in zinc oxide is 1 to 7 mass % according to gallium oxide conversion;

3) The high-density gallium oxide/zinc oxide sintered sputtering target according to paragraph 1) or paragraph 2) above, wherein the sintered density is 5.45 g/cm$^3$ or greater; and 4) The high-density gallium oxide/zinc oxide sintered sputtering target according to any one of paragraphs 1) to 3) above, wherein the bulk resistance value of the target is 3.0 mΩ or less.

The present invention additionally provides:

5) A method of forming a transparent conductive film for forming a thin film composed of gallium oxide/zinc oxide containing 20 massppm or greater of each of zirconium oxide and aluminum oxide, wherein the total content thereof is less than 250 ppm, on a substrate by performing sputtering with the use of a gallium oxide/zinc oxide target containing 20 massppm or greater of each of zirconium oxide and aluminum oxide, wherein the total content thereof is less than 250 ppm; and 6) The method of forming a transparent conductive film according to paragraph 5) above, wherein the gallium concentration in zinc oxide in the transparent conductive film is 1 to 7 mass % according to gallium oxide conversion.

The present invention further provides:

7) A transparent conductive film superior in conductivity composed of gallium oxide/zinc oxide, wherein the gallium oxide/zinc oxide transparent conductive film formed on a substrate by sputtering contains 20 massppm or greater of each of zirconium oxide and aluminum oxide and the total content thereof is less than 250 ppm; and 8) The transparent conductive film superior in conductivity according to paragraph 7) above, wherein the gallium concentration in zinc oxide in the transparent conductive film is 1 to 7 mass % according to gallium oxide conversion.

The gallium oxide ($Ga_2O_3$)/zinc oxide (ZnO) sputtering target (GZO target) of the present invention contains 20 massppm or greater of each of zirconium oxide and aluminum oxide, and the total content thereof is less than 250 ppm. It is thereby possible to obtain a target having high density, low bulk resistance and minimal compositional variation by increasing the sinterability of the GZO target. And, it enables a stable deposition of GZO film by sputtering with the use of this target. As a result, the present invention yields a superior effect of being able to obtain a target that inhibits the formation of nodules during the sputtering deposition, reduces the abnormal electrical discharge for a long period of time, and prevents the generation of particles.

Further, as a result of using the foregoing target, the present invention yields a significant effect in that it is possible to form a transparent conductive film having a high transmission factor and a low resistance value, and provide a transparent conductive film formed thereby.

DETAILED DESCRIPTION OF THE INVENTION

Generally speaking, conductivity of the transparent conductive film is represented as sheet resistivity (Ω/□), and sheet resistivity of roughly 5Ω/□ is ordinarily required. In the application in the liquid crystal display screen described above, higher resolution of the liquid crystal screen and lower sheet resistivity are required. The sheet resistivity is represented as a value obtained by dividing the specific resistance with the thickness of the transparent conductive film.

The areal conductivity of the transparent conductive film is represented as the product of the conductivity (inverse of specific resistance) and the film thickness, and this conductivity σ ($Ω^{-1}·cm^{-1}$) is represented as the product of the charge e (coulomb) of a carrier (electron hole or electron) contained in the film, the carrier mobility μ (cm$^2$/V·sec) and the carrier concentration n (cm$^{-3}$) ($σ(Ω^{-1}·cm^{-1})$=e·μ·n).

Therefore, in order to improve the conductivity of the transparent conductive film and reduce the specific resistance (also referred to as resistivity) and the sheet resistivity, it is necessary to increase the carrier mobility μ (cm$^2$/V·sec) and/or the carrier concentration n (cm$^{-3}$).

The gallium oxide/zinc oxide sintered sputtering target of the present invention is superior as a target for forming a transparent conductive film having such film characteristics. Desirably, the gallium content in zinc oxide is 1 to 7 mass % according to gallium oxide conversion.

As a factor that influences the film characteristics during sputtering, there is the target density described above. The higher target density, the less formation of nodules. Also, the generation of an abnormal electrical discharge and particles can be inhibited for a long period of time, and a film with stable and favorable sputtering characteristics can be obtained.

Meanwhile, since the bulk resistance value of the target is directly reflected on the resistivity of the transparent conductive film, it is necessary to inhibit the increase of the bulk resistance value as much as possible.

As dopants capable of achieving high densification in the gallium oxide/zinc oxide sintered sputtering target of the present invention, it has become known that zirconium oxide ($ZrO_2$) and aluminum oxide ($Al_2O_3$) are extremely effective. The GZO target of the present invention contains 20 massppm or greater of each of zirconium oxide ($ZrO_2$) and aluminum oxide ($Al_2O_3$) and the total content thereof is made to be less than 250 ppm.

Further, zirconium oxide and aluminum oxide have characteristics of dissolving in GZO, and maintaining the bulk resistance value at low levels as described later. Addition of such zirconium oxide and aluminum oxide is the most important aspect of the present invention.

If the zirconium oxide and aluminum oxide are respectively less than 20 massppm, it is not possible to achieve the high densification of the target. Therefore, zirconium oxide and aluminum oxide are respectively added at 20 massppm or greater. Meanwhile, if the total content of zirconium oxide and aluminum oxide exceeds 250 massppm, the density will deteriorate and the bulk resistance value will increase. The excess addition of zirconium oxide and aluminum oxide will also entail a problem of inducing cracks in the target. Therefore, it is necessary to keep the total content of zirconium oxide and aluminum oxide to be 250 massppm or less.

Further, the sintered density of the high-density gallium oxide/zinc oxide sintered sputtering target according to the present invention is able to achieve a value of 5.45 g/cm$^3$ or higher, and even 5.50 g/cm$^3$ or higher depending on the sintering conditions.

Moreover, the bulk resistance value of the high-density gallium oxide/zinc oxide sintered sputtering target according to the present invention is able to achieve a value of 3.0 mΩ or less. A conventional gallium oxide/zinc oxide sintered sputtering target is not able to simultaneously achieve high densification where the sintered density is 5.55 g/cm$^3$ or higher and a bulk resistance value of 3.0 mΩ or less.

Since the bulk resistance value of the target is directly reflected on the resistivity of the transparent conductive film, it is possible to obtain a gallium oxide/zinc oxide transparent conductive film, which contains 1 to 7 mass % of gallium oxide and is superior in conductivity and optical transparency.

There is no particular limitation in the manufacturing method of the GZO target according to the present invention, and a prescribed amount (1 to 7 mass %) of gallium oxide ($Ga_2O_3$) powder, powder in which the total content of trace amounts of zirconium oxide ($ZrO_2$) powder and trace amounts of aluminum oxide ($Al_2O_3$) powder is 20 to less than 250 massppm, and residual quantity of zinc oxide (ZnO) powder are prepared.

Generally speaking, in order to improve the target density, it would be preferable that the powder before formation is as fine as possible. Nevertheless, in the present invention, since the foregoing zirconium oxide (zirconia) is used as the dopant to be added to the GZO, the zirconium oxide can be used as a pulverization medium. In other words, zirconia beads or a zirconia lining vessel can be used for pulverization, and there is an advantage in that the pulverizing medium itself will not become a pollution source (contamination source).

Thereby, there is a significant advantage in that the pulverization level can be improved and a sputtering target having a higher purity and a higher density in comparison to conventional technology can be obtained.

For example, a mixed powder slurry having a median size of 0.8 μm can be obtained by performing mixing and pulverization with an attritor. This slurry is granulated to obtain spherical granulated powder. Further, the granulated powder may be subject to press molding, and further subject to CIP (cold isostatic press). Then, this compact is subject to sintering in an oxygen atmosphere at a temperature of 1000 to 1600° C. for roughly 1 to 5 hours to obtain a sintered compact.

Incidentally, the sintering conditions can be arbitrarily changed, and the manufacturing method of powder can be changed from the method described above. There is no particular limitation. Accordingly, it is possible to achieve a sintered density of 5.45 g/cm$^3$ or higher, and even 5.50 g/cm$^3$ or higher by selecting the sintering temperature.

This sintered compact is ground and cut, and it is processed into a sputtering target of a prescribed shape. A gallium oxide/zinc oxide sintered sputtering target containing 1 to 7 mass % of gallium oxide is thereby obtained.

Subsequently, the sintered sputtering target is used to perform DC sputtering, RF sputtering, or magnetron sputtering to a glass substrate in order to form a transparent electrode film. Though a glass of optical transparency is generally used as the substrate, it is not particularly limited to glass-made substrate.

Since the gallium oxide/zinc oxide sintered target has conductivity, it can be easily deposited with DC sputtering. Therefore, it is preferable to use DC sputtering to perform deposition since it is simple, highly reliable and most stable. Representative examples of the DC sputtering conditions are shown below.

The sputtering conditions can be arbitrarily changed.
Sputtering gas: Ar: 90 to 100%, $O_2$: 0 to 10%
Sputtering gas pressure: 0.1 to 5 Pa
Electrical energy: 0.2 to 6 W/cm$^2$
Deposition speed: Approximately 100 to 300 Å/min
Substrate temperature: Room temperature to 300° C.

EXAMPLES

Examples of the present invention are now explained. Incidentally, these examples are merely illustrative, and the present invention shall in no way be limited thereby. In other words, the present invention shall only be limited by the scope hereof, and shall include the various modifications other than the Examples of this invention.

Example 1

Zirconium oxide ($ZrO_2$) powder having an average grain size of 1 μm or less was weighed at 50 massppm, aluminum oxide ($Al_2O_3$) powder having an average grain size of 1 μm or less was weighed at 20 massppm, and these powders were further weighed so that gallium oxide ($Ga_2O_3$) was to be 5 mass % and the remainder was to be zinc oxide (ZnO).

These powders were mixed and pulverized in an attritor with zirconia ($ZrO_2$) balls or beads as the pulverization medium to obtain a mixed powder slurry having a median size of 0.8 μm.

This slurry was granulated to obtain spherical granulated powder. The granulated powder was subject to press molding, and further subject to CIP (cold isostatic press). The obtained compact was sintered in the atmosphere at the temperatures of 1450° C. and 1500° C. for 5 hours respectively to obtain a sintered compact. The sintered compact was ground and cut, and it was processed into a sputtering target of a prescribed shape.

The density and bulk resistance value of the obtained sintered target were measured. The results are shown in Table 1. The zirconium oxide ($ZrO_2$) and aluminum oxide ($Al_2O_3$)

contained in the target were sought by measuring the amount of zirconium and aluminum by ICP (inductively-coupled plasma method) so as to seek the converted quantity of $ZrO_2$ in relation to the overall amount of the target. The amount of $ZrO_2$ contained in the target was roughly the same as the additive amount before sintering.

The target density was measured by the Archimedean method. Further, the bulk resistance value was obtained by randomly setting forth 5 measurement locations across the entire mirror polished target, and measuring such value using the four-probe method at a depth position of 2 mm from the surface of the cutting plane of the target, and the average value thereof was used.

Table 1 shows the case of sintering at 1450° C., and the high-density gallium oxide/zinc oxide sintered sputtering target of Example 1 in which 50 massppm of zirconium oxide and 20 massppm of aluminum oxide were added showed significant improvements in the density and bulk resistance value in comparison to a gallium oxide/zinc oxide sintered sputtering target with no addition of $ZrO_2$ and $Al_2O_3$ (Comparative Example 1 described later). In other words, the target of Example 1 had a density of 5.45 g/cm$^3$ and a bulk resistance value of 2.57 mΩ·cm, and it is evident that favorable high density and low bulk resistance value have been obtained.

Similarly, as shown in Table 1, with the case of sintering at 1500° C., the high-density gallium oxide/zinc oxide sintered

TABLE 1

| | $ZrO_2$ ppm | $Al_2O_3$ ppm | Density g/cm$^3$ | Bulk Resistance mΩ · cm | Nodules Coverage (%) | Abnormal Electrical Discharge Count (10 Hours Later) |
|---|---|---|---|---|---|---|
| | | | Sintering at 1500° C. | | | |
| Example 1 | 50 | 20 | 5.55 | 2.32 | 0.377 | 222 |
| Example 2 | 100 | 20 | 5.57 | 2.23 | 0.325 | 202 |
| Example 3 | 20 | 50 | 5.55 | 2.26 | 0.389 | 231 |
| Example 4 | 20 | 100 | 5.55 | 2.26 | 0.380 | 224 |
| Example 5 | 50 | 100 | 5.55 | 2.25 | 0.372 | 218 |
| Example 6 | 100 | 50 | 5.58 | 2.21 | 0.293 | 187 |
| Example 7 | 100 | 100 | 5.56 | 2.29 | 0.358 | 217 |
| Example 8 | 20 | 200 | 5.55 | 2.40 | 0.374 | 220 |
| Example 9 | 200 | 20 | 5.60 | 2.11 | 0.228 | 156 |
| Example 10 | 50 | 180 | 5.55 | 2.41 | 0.388 | 231 |
| Comparative Example 1 | 0 | 0 | 5.52 | 3.00 | 0.420 | 250 |
| Comparative Example 2 | 200 | 50 | 5.48 | 2.32 | 0.631 | 350 |
| Comparative Example 3 | 50 | 1000 | 5.47 | 2.70 | 0.665 | 367 |
| | | | Sintering at 1450° C. | | | |
| Example 1 | 50 | 20 | 5.45 | 2.57 | 0.731 | 398 |
| Example 2 | 100 | 20 | 5.47 | 2.73 | 0.665 | 368 |
| Example 3 | 20 | 50 | 5.46 | 2.60 | 0.698 | 383 |
| Example 4 | 20 | 100 | 5.42 | 2.57 | 0.831 | 445 |
| Example 5 | 50 | 100 | 5.49 | 2.41 | 0.598 | 335 |
| Example 6 | 100 | 50 | 5.45 | 2.50 | 0.731 | 398 |
| Example 7 | 100 | 100 | 5.47 | 2.51 | 0.665 | 367 |
| Example 8 | 20 | 200 | 5.44 | 2.68 | 0.765 | 414 |
| Example 9 | 200 | 20 | 5.49 | 2.35 | 0.598 | 335 |
| Example 10 | 50 | 180 | 5.43 | 2.64 | 0.798 | 430 |
| Comparative Example 1 | 0 | 0 | 5.39 | 3.17 | 0.925 | 483 |
| Comparative Example 2 | 200 | 50 | 5.35 | 2.94 | 1.068 | 557 |
| Comparative Example 3 | 50 | 1000 | 5.36 | 3.25 | 1.034 | 542 |

As shown in Table 1, the tendency is that the density increases and the bulk resistance value decreases as the sintering temperature increases from 1450° C. to 1500° C.

Nevertheless, when the sintering temperature rises, the material begins to evaporate (volatilize), and there is a possibility that composition variations will occur since the amount of evaporation differs depending on the component configuring the target. In particular, zinc oxide will partially evaporate from the target surface, and this becomes more prominent as the temperature gets higher. It is necessary to remove the layer subject to composition variation. If the layers subject to composition variation on the surface increase due to sintering at high temperatures, there is a problem in that the amount to be cut will increase and it causes the yield ratio to deteriorate. Thus, if possible, it is desirable to perform sintering at a lower temperature.

Therefore, although sintering at low temperatures is desirable, since this will lead to low density and high bulk resistance, it would be ideal to adjust the balance thereof and select a temperature according to the requisite conditions of density and bulk resistance in the target.

sputtering target of Example 1 in which 50 massppm of zirconium oxide and 20 massppm of aluminum oxide were added showed significant improvements in the density and bulk resistance value in comparison to a gallium oxide/zinc oxide sintered sputtering target with no addition of $ZrO_2$ and $Al_2O_3$ (Comparative Example 1 described later).

In other words, the target of Example 1 had a density of 5.55 g/cm$^3$ and a bulk resistance value of 2.32 mΩ·cm, and it is evident that favorable high density and low bulk resistance value have been obtained.

Subsequently, this sputtering target was used to perform DC sputtering on a glass substrate under the following conditions, and the generation (coverage factor) of nodules and abnormal electrical discharge were measured and observed. The generation (coverage factor) of nodules was measured based on surface measurement 1 hour after the commencement of sputtering, and the abnormal electrical discharge was measured based on the abnormal electrical discharge 10 hours after sputtering. The sputtering conditions are shown below.

Sputtering gas: Ar (100%)
Sputtering gas pressure: 0.6 Pa

Electrical energy: 1500 W
Deposition speed: 120 Å/min

As a result, the coverage factor of nodules was low at 0.731% in the case of sintering at 1450° C., and the coverage factor of nodules was also low at 0.377% in the case of sintering at 1500° C. When the number of abnormal electrical discharges that occurred 10 hours after sputtering was observed, the count was 398 times in the case of sintering at 1450° C. and 222 times in the case of sintering at 1500° C. It has been confirmed that the number of abnormal electrical discharges was lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Examples 2 to 10

With respect to Examples 2 to 10, the same components as Example 1 were sintered according to the same conditions as Example 1 upon changing the compounding ratio, and the density and bulk resistance value were measured. In addition, the coverage factor of nodules and the number of abnormal electrical discharges upon preparing a target and performing sputtering to this target were also measured. The method of preparing the target and the various measurement methods are the same as those used in Example 1. The results are also shown in Table 1.

Evaluation Result of Example 2

As shown in Table 1, with the high-density gallium oxide/zinc oxide sintered sputtering target of Example 2 in which 100 massppm of zirconium oxide and 20 massppm of aluminum oxide were added (incidentally, the additive amount of gallium oxide ($Ga_2O_3$) being 5 mass % and the remainder being zinc oxide (ZnO) is the same as Example 1, and this description is omitted in the explanation of the following Examples), the density and bulk resistance value improved significantly when sintering was performed at 1450° C. In other words, the target of Example 2 had a density of 5.47 g/cm$^3$ and a bulk resistance value of 2.73 mΩ·cm, and it is evident that favorable high density and low bulk resistance value have been obtained.

When sintering was performed at 1500° C., the target of Example 2 had a density of 5.57 g/cm$^3$ and a bulk resistance value of 2.23 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.665% in the case of sintering at 1450° C., and the coverage factor of nodules was also low at 0.325% in the case of sintering at 1500° C. When the number of abnormal electrical discharges that occurred 10 hours after sputtering was observed, the count was 368 times in the case of sintering at 1450° C. and 202 times in the case of sintering at 1500° C., and it was reduced significantly.

As described above, it has been confirmed that the sintered target of Example 2 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 3

As shown in Table 1, with the high-density gallium oxide/zinc oxide sintered sputtering target of Example 3 in which 20 massppm of zirconium oxide and 50 massppm of aluminum oxide were added, the density and bulk resistance value improved significantly when sintering was performed at 1450° C. In other words, the target of Example 3 had a density of 5.46 g/cm$^3$ and a bulk resistance value of 2.60 mΩ·cm, and it is evident that favorable high density and low bulk resistance value have been obtained.

When sintering was performed at 1500° C., the target of Example 3 had a density of 5.55 g/cm$^3$ and a bulk resistance value of 2.26 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.698% in the case of sintering at 1450° C., and the coverage factor of nodules was also low at 0.389% in the case of sintering at 1500° C. When the number of abnormal electrical discharges that occurred 10 hours after sputtering was observed, the count was 383 times in the case of sintering at 1450° C. and 231 times in the case of sintering at 1500° C., and it was reduced significantly.

As described above, it has been confirmed that the sintered target of Example 3 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 4

As shown in Table 1, with the high-density gallium oxide/zinc oxide sintered sputtering target of Example 4 in which 20 massppm of zirconium oxide and 100 massppm of aluminum oxide were added, the density and bulk resistance value improved significantly when sintering was performed at 1450° C. In other words, the target of Example 4 had a density of 5.42 g/cm$^3$ and a bulk resistance value of 2.57 mΩ·cm, and it is evident that favorable high density and low bulk resistance value have been obtained.

When sintering was performed at 1500° C., the target of Example 4 had a density of 5.55 g/cm³ and a bulk resistance value of 2.26 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.831% in the case of sintering at 1450° C., and the coverage factor of nodules was also low at 0.380% in the case of sintering at 1500° C. When the number of abnormal electrical discharges that occurred 10 hours after sputtering was observed, the count was 445 times in the case of sintering at 1450° C. and 224 times in the case of sintering at 1500° C., and it was reduced significantly.

As described above, it has been confirmed that the sintered target of Example 4 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 5

As shown in Table 1, with the high-density gallium oxide/zinc oxide sintered sputtering target of Example 5 in which 50 massppm of zirconium oxide and 100 massppm of aluminum oxide were added, the density and bulk resistance value improved significantly when sintering was performed at 1450° C. In other words, the target of Example 5 had a density of 5.49 g/cm³ and a bulk resistance value of 2.41 mΩ·cm, and it is evident that favorable high density and low bulk resistance value have been obtained.

When sintering was performed at 1500° C., the target of Example 5 had a density of 5.55 g/cm³ and a bulk resistance value of 2.25 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.598% in the case of sintering at 1450° C., and the coverage factor of nodules was also low at 0.372% in the case of sintering at 1500° C. When the number of abnormal electrical discharges that occurred 10 hours after sputtering was observed, the count was 335 times in the case of sintering at 1450° C. and 218 times in the case of sintering at 1500° C., and it was reduced significantly.

As described above, it has been confirmed that the sintered target of Example 5 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 6

As shown in Table 1, with the high-density gallium oxide/zinc oxide sintered sputtering target of Example 6 in which 100 massppm of zirconium oxide and 50 massppm of aluminum oxide were added, the density and bulk resistance value improved significantly when sintering was performed at 1450° C. In other words, the target of Example 6 had a density of 5.45 g/cm³ and a bulk resistance value of 2.50 mΩ·cm, and it is evident that favorable high density and low bulk resistance value have been obtained.

When sintering was performed at 1500° C., the target of Example 6 had a density of 5.58 g/cm³ and a bulk resistance value of 2.21 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.731% in the case of sintering at 1450° C., and the coverage factor of nodules was also low at 0.293% in the case of sintering at 1500° C. When the number of abnormal electrical discharges that occurred 10 hours after sputtering was observed, the count was 398 times in the case of sintering at 1450° C. and 187 times in the case of sintering at 1500° C., and it was reduced significantly.

As described above, it has been confirmed that the sintered target of Example 6 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 7

As shown in Table 1, with the high-density gallium oxide/zinc oxide sintered sputtering target of Example 7 in which 100 massppm of zirconium oxide and 100 massppm of aluminum oxide were added, the density and bulk resistance value improved significantly when sintering was performed at 1450° C. In other words, the target of Example 7 had a density of 5.47 g/cm³ and a bulk resistance value of 2.51 mΩ·cm, and it is evident that favorable high density and low bulk resistance value have been obtained.

When sintering was performed at 1500° C., the target of Example 7 had a density of 5.56 g/cm³ and a bulk resistance value of 2.29 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.665% in the case of sintering at 1450° C., and the coverage factor of nodules was also low at 0.358% in the case of sintering at 1500° C. When the number of abnormal electrical discharges that occurred 10 hours after sputtering was observed, the count was 367 times in the case of sintering at 1450° C. and 217 times in the case of sintering at 1500° C., and it was reduced significantly.

As described above, it has been confirmed that the sintered target of Example 7 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 8

As shown in Table 1, with the high-density gallium oxide/zinc oxide sintered sputtering target of Example 8 in which 20 massppm of zirconium oxide and 200 massppm of aluminum oxide were added, the density and bulk resistance value improved significantly when sintering was performed at 1450° C. In other words, the target of Example 8 had a density of 5.44 g/cm$^3$ and a bulk resistance value of 2.68 mΩ·cm, and it is evident that favorable high density and low bulk resistance value have been obtained.

When sintering was performed at 1500° C., the target of Example 8 had a density of 5.55 g/cm$^3$ and a bulk resistance value of 2.40 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.765% in the case of sintering at 1450° C., and the coverage factor of nodules was also low at 0.374% in the case of sintering at 1500° C. When the number of abnormal electrical discharges that occurred 10 hours after sputtering was observed, the count was 414 times in the case of sintering at 1450° C. and 220 times in the case of sintering at 1500° C., and it was reduced significantly.

As described above, it has been confirmed that the sintered target of Example 8 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 9

As shown in Table 1, with the high-density gallium oxide/zinc oxide sintered sputtering target of Example 9 in which 200 massppm of zirconium oxide and 20 massppm of aluminum oxide were added, the density and bulk resistance value improved significantly when sintering was performed at 1450° C. In other words, the target of Example 9 had a density of 5.49 g/cm$^3$ and a bulk resistance value of 2.35 mΩ·cm, and it is evident that favorable high density and low bulk resistance value have been obtained.

When sintering was performed at 1500° C., the target of Example 9 had a density of 5.60 g/cm$^3$ and a bulk resistance value of 2.11 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.598% in the case of sintering at 1450° C., and the coverage factor of nodules was also low at 0.228% in the case of sintering at 1500° C. When the number of abnormal electrical discharges that occurred 10 hours after sputtering was observed, the count was 335 times in the case of sintering at 1450° C. and 156 times in the case of sintering at 1500° C., and it was reduced significantly.

As described above, it has been confirmed that the sintered target of Example 9 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Evaluation Result of Example 10

As shown in Table 1, with the high-density gallium oxide/zinc oxide sintered sputtering target of Example 10 in which 50 massppm of zirconium oxide and 180 massppm of aluminum oxide were added, the density and bulk resistance value improved significantly when sintering was performed at 1450° C. In other words, the target of Example 10 had a density of 5.43 g/cm$^3$ and a bulk resistance value of 2.64 mΩ·cm, and it is evident that favorable high density and low bulk resistance value have been obtained.

When sintering was performed at 1500° C., the target of Example 10 had a density of 5.55 g/cm$^3$ and a bulk resistance value of 2.41 mΩ·cm, and it is evident that even more favorable high density and low bulk resistance value have been obtained.

Subsequently, this sputtering target was used to perform DC sputtering on a glass substrate under the foregoing conditions, and the generation (coverage factor) of nodules and abnormal electrical discharge were measured and observed.

As a result, the coverage factor of nodules was low at 0.798% in the case of sintering at 1450° C., and the coverage factor of nodules was also low at 0.388% in the case of sintering at 1500° C. When the number of abnormal electrical discharges that occurred 10 hours after sputtering was observed, the count was 430 times in the case of sintering at 1450° C. and 231 times in the case of sintering at 1500° C., and it was reduced significantly.

As described above, it has been confirmed that the sintered target of Example 10 is a favorable target in which the coverage factor of nodules and number of abnormal electrical discharges were lower in comparison to the Comparative Examples described later.

Further, the specific resistance (Ω·cm) of deposition and the film characteristics of the transmission factor % at 550 nm were examined, but these were comparable to a standard ITO film, and showed a favorable optical transmission factor and high conductivity. In the foregoing Example, although a case was explained regarding a gallium oxide/zinc oxide sintered sputtering target having $Ga_2O_3$ in an additive amount of 5 mass %, the same effects can be obtained so as long as gallium oxide is added within the range of 1 to 7 mass %.

Comparative Examples 1, 2, and 3

In each case where zirconium oxide and aluminum oxide were not added (Comparative Example 1), $ZrO_2$ powder and aluminum oxide powder having an average grain size of 1 μm or less were weighed out respectively 200 massppm and 50 massppm and added (Comparative Example 2), and $ZrO_2$ powder and aluminum oxide powder having an average grain size of 1 μm or less were weighed out respectively 50 massppm and 1000 massppm and added (Comparative Example 3), these powders were further weighed so that gallium oxide ($Ga_2O_3$) was to be 5 mass % and the remainder was to be zinc oxide (ZnO).

These powders were mixed and pulverized in an attritor with zirconia ($ZrO_2$) balls or beads as the pulverization medium to obtain a mixed powder slurry having a median size of 0.8 μm. This slurry was granulated to obtain spherical granulated powder.

The granulated powder was subject to press molding, and further subject to CIP (cold isostatic press). The obtained compact was sintered in the atmosphere at the temperatures of 1450° C. and 1500° C. for 5 hours respectively to obtain a sintered compact. The sintered compact was ground and cut, and it was processed into a sputtering target of a prescribed shape.

The density and bulk resistance value of the obtained sintered target were measured. The results are also shown in Table 1. The amount of zirconium oxide ($ZrO_2$) and aluminum oxide ($Al_2O_3$) contained in the target, the target density and the bulk resistance value thereof were measured using the same methods as the Examples.

As shown in Table 1, in the case of Comparative Example 1 which is a gallium oxide/zinc oxide sintered sputtering target with no addition of $ZrO_2$ and $Al_2O_3$, the target had a sintered density of 5.39 g/cm$^3$ and a bulk resistance value of 3.17 mΩ·cm when sintering was performed at 1450° C., and a sintered density of 5.52 g/cm$^3$ and a bulk resistance value of 3.00 mΩ·cm when sintering was performed at 1500° C.

As shown above, under the same sintering conditions, the Comparative Examples showed lower density and higher bulk resistance in comparison to the Examples, and it is evident that the Comparative Examples are inadequate as a gallium oxide/zinc oxide sintered sputtering target.

The target shown in Comparative Example 2 is a gallium oxide/zinc oxide sintered sputtering target containing 200 massppm of zirconium oxide and 50 massppm of aluminum oxide (the total additive content thereof was 250 massppm).

The total additive content of zirconium oxide and aluminum oxide in the target of Comparative Example 2 exceeds the upper limit of the present invention, but is similar. Therefore, there is no significant difference in the characteristics in comparison to the Examples. Nevertheless, when sintering was performed at 1450° C., the density deteriorated to 5.35 g/cm$^3$ and the bulk resistance value increased to 2.94 mΩ·cm. When sintering was performed at 1500° C., the density deteriorated to 5.48 g/cm$^3$ and the bulk resistance value was 2.32 mΩ·cm in comparison to the Examples. Thus, it is evident that this is an undesirable target since the density deteriorated in comparison to the Examples.

The target shown in Comparative Example 3 is a gallium oxide/zinc oxide sintered sputtering target containing 50 massppm of zirconium oxide and 1000 massppm of aluminum oxide (the total additive content thereof was 1050 massppm).

The total additive content of zirconium oxide and aluminum oxide in the target of Comparative Example 3 exceeds the upper limit of the present invention considerably. When sintering was performed at 1450° C., the density deteriorated to 5.36 g/cm$^3$ and the bulk resistance value increased to 3.25 mΩ·cm. When sintering was performed at 1500° C., the density deteriorated to 5.47 g/cm$^3$ and the bulk resistance value increased to 2.70 mΩ·cm. Thus, it is evident that this is an undesirable target since the density deteriorated and the bulk resistance value increased in comparison to the Examples.

Subsequently, under the same conditions as the Examples, these sintered targets were used to perform DC sputtering on a glass substrate in order to form a transparent electrode film.

As with the Examples, the generation (coverage factor) of nodules was measured based on surface measurement 1 hour after the commencement of sputtering, and the abnormal electrical discharge was measured based on the abnormal electrical discharge 10 hours after sputtering. The results are also shown in Table 1.

The gallium oxide/zinc oxide sintered sputtering target with no addition of zirconium oxide of Comparative Example 1, which was sintered at 1450° C. and 1500° C., could be used in DC sputtering, but the coverage factors of nodules were respectively 0.925% and 0.420% and the numbers of abnormal electrical discharges were respectively 483 times and 250 times. These were greater than the Examples and inferior.

With the gallium oxide/zinc oxide sintered sputtering target containing 200 massppm of zirconium oxide and 50 massppm of aluminum oxide shown in Comparative Example 2, the coverage factors of nodules when sintering was performed at 1450° C. and 1500° C. were respectively 1.068% and 0.631% and the numbers of abnormal electrical discharges were respectively 557 times and 350 times. These were greater than the Examples. In comparison to the Examples, the coverage factor of nodules and the number of abnormal electrical discharges increased, and were inferior.

With the target containing 50 massppm of zirconium oxide and 1000 massppm of aluminum oxide shown in Comparative Example 3, the coverage factors of nodules when sintering was performed at 1450° C. and 1500° C. were respectively 1.034% and 0.665% and the numbers of abnormal electrical discharges were respectively 542 times and 367 times. These were greater than the Examples. In comparison to the Examples, the coverage factor of nodules and the number of abnormal electrical discharges increased, and were inferior.

As described above, the addition of an adequate amount of zirconium oxide is able to improve the sputtering characteristics; specifically, it is possible to inhibit the coverage factor of nodules, inhibit the occurrence of abnormal electrical discharges caused by such nodules, inhibit the generation of particles caused by splashes, and effectively inhibit deterioration in the quality of the conductive film.

Nevertheless, these effects cannot be achieved if the additive amount of zirconium oxide and the additive amount of aluminum oxide are respectively less than 20 massppm. Moreover, if the total additive amount of zirconium oxide and aluminum oxide exceeds 250 massppm, there are problems that the bulk resistance value will increase, the sintered density cannot be improved and cracks will occur. Thus, it is suitable to set the upper limit of the total additive amount of zirconium oxide and aluminum oxide to be less than 250 massppm.

Further, zirconium oxide may also be used as a pulverization medium. In other words, the zirconia beads or zirconia lining vessel can be used for pulverization, and there is an advantage in that the pulverized medium itself will not become a pollution source (contamination source). Accordingly, the addition of an adequate amount (trace amounts) of zirconium oxide is extremely effective in improving the sputtering characteristics.

The gallium oxide ($Ga_2O_3$)/zinc oxide (ZnO) sputtering target (GZO target) of the present invention contains 20 massppm or greater of each of zirconium oxide and aluminum oxide, and the total content thereof is made to be less than 250 ppm. It is thereby possible to stabilize the sinterability of the GZO target, and obtain a target having high density, low bulk resistance value, and minimal compositional variation.

The present invention also yields an effect of realizing stable deposition of the GZO film by sputtering the foregoing target. As a result, the present invention is able to inhibit the formation of nodules during the sputtering deposition, reduce the abnormal electrical discharge for a long period of time, and prevent the generation of particles. Therefore, it is possible to obtain a transparent conductive film capable of maintaining a favorable optical transmission factor and conductivity.

Accordingly, the present invention can be widely used as a transparent electrode (film) of display devices such as a liquid crystal display and an electro luminescence display, as well as in solar batteries.

The invention claimed is:

1. A gallium oxide/zinc oxide sintered sputtering target for forming a transparent conductive film containing 20 massppm or greater of each of zirconium oxide and aluminum oxide, wherein the total content thereof is less than 250 ppm, the bulk resistance value of the target is 3.0 mΩ·cm or less, and sintered density of the target is 5.45 g/cm$^3$ or greater.

2. The gallium oxide/zinc oxide sintered sputtering target for forming a transparent conductive film according to claim 1, wherein the gallium concentration in zinc oxide is 1 to 7% according to gallium oxide conversion.

3. The gallium oxide/zinc oxide sintered sputtering target for forming a transparent conductive film according to claim 2, wherein the sintered density is 5.50 g/cm$^3$ or greater.

4. A gallium oxide/zinc oxide sintered sputtering target for forming a transparent conductive film according to claim 1, wherein the sintered density is 5.50 g/cm$^3$ or greater.

5. A method of forming a transparent conductive film comprising the step of forming a thin film composed of gallium oxide/zinc oxide containing 20 massppm or greater of each of zirconium oxide and aluminum oxide, wherein the total content thereof is less than 250 ppm, on a substrate by performing sputtering with the use of a gallium oxide/zinc oxide target containing 20 massppm or greater of each of zirconium oxide and aluminum oxide, wherein the total content thereof is less than 250 ppm, the bulk resistance value of the target is 3.0 mΩ·cm or less, and sintered density of the target is 5.45 g/cm$^3$ or greater.

6. The method of forming a transparent conductive film according to claim 5, wherein the gallium concentration in zinc oxide in the transparent conductive film is 1 to 7% according to gallium oxide conversion.

7. A method according to claim 5, wherein the sintered density of the target used in said sputtering is 5.50 g/cm$^3$ or higher.

8. A transparent conductive film consisting of gallium oxide/zinc oxide; and 20 massppm or greater of each of zirconium oxide and aluminum oxide formed on a substrate by sputtering with the use of a gallium oxide/zinc oxide target containing 20 massppm or greater of each of zirconium oxide and aluminum oxide, the total content of zirconium oxide and aluminum oxide being less than 250 ppm and the bulk resistance value of the target is 3.0 mΩ or less.

9. The transparent conductive film superior in conductivity according to claim 8, wherein the gallium concentration in zinc oxide in the transparent conductive film is 1 to 7 mass % according to gallium oxide conversion.

* * * * *

UNITED STATES PATENT AND TRADEMARK OFFICE
CERTIFICATE OF CORRECTION

PATENT NO. : 7,674,404 B2
APPLICATION NO. : 12/094024
DATED : March 9, 2010
INVENTOR(S) : Kozo Osada It is certified that error appears in the above-identified patent and that said Letters Patent is hereby corrected as shown below:

Column 14, line 59 --m∩•cm-- should read --mΩ•cm--

Column 18, line 10 --1 to 7%-- should read --1 to 7 mass %--

Column 18, line 32 --1 to 7%-- should read --1 to 7 mass %--

Signed and Sealed this

Fifteenth Day of June, 2010

David J. Kappos
*Director of the United States Patent and Trademark Office*